United States Patent [19]
Shibata

[11] Patent Number: 5,293,407
[45] Date of Patent: Mar. 8, 1994

[54] DIGITAL MODULATOR WITH DIGITAL POWER CONTROL CIRCUIT

[75] Inventor: Takayuki Shibata, Tokyo, Japan

[73] Assignee: NEC Corporation, Tokyo, Japan

[21] Appl. No.: 964,841

[22] Filed: Oct. 22, 1992

[30] Foreign Application Priority Data

Oct. 23, 1991 [JP] Japan .................................. 3-275535

[51] Int. Cl.$^5$ .................................................. H04L 25/03
[52] U.S. Cl. ..................................... 375/60; 332/103
[58] Field of Search .................. 375/59, 60, 39, 67; 332/103, 104, 145

[56] References Cited

U.S. PATENT DOCUMENTS

| | | | |
|---|---|---|---|
| 4,860,316 | 8/1989 | Takenaka et al. | 375/39 |
| 4,881,049 | 11/1989 | Yagi | 375/67 |
| 5,012,208 | 4/1991 | Makinen et al. | 375/60 |
| 5,093,637 | 3/1992 | Isota et al. | 375/60 |
| 5,172,394 | 12/1992 | Kuster et al. | 332/103 |

FOREIGN PATENT DOCUMENTS

0307377 3/1989 European Pat. Off. .

*Primary Examiner*—Stephen Chin
*Attorney, Agent, or Firm*—Sughrue, Mion, Zinn, Macpeak & Seas

[57] ABSTRACT

A digital modulator comprises a power control circuit for producing a digital power control signal, first and second digital multipliers for multiplying digital signals having orthogonal phase relationships with the digital power control signal, and first and second digital-to-analog (D/A) converters for converting digital output signals from the first and second multipliers into analog signals. First and second low-pass filters are connected to outputs of the D/A converters, respectively, to filter out high frequency components. An orthogonal modulator is provided for mixing orthogonal phase carriers with the outputs of the first and second low-pass filters to produce first and second orthogonally modulated signals and combining the modulated signals to produce a transmit signal, which is amplified for transmission.

7 Claims, 2 Drawing Sheets

DIGITAL MODULATOR WITH DIGITAL POWER CONTROL CIRCUIT

BACKGROUND OF THE INVENTION

The present invention relates generally to digital modulators, and more specifically to a base-station digital modulator for mobile communications system in which the transmission power of the base station is varied to compensate for variations in distance to mobile units.

In mobile communications systems, the transmission power level of the base station is controlled in response to the power level of a signal received from the mobile unit so that the signal transmitted from the base station can be received at the mobile unit at a constant power level. With conventional digital modulators, this transmission power control is performed by a variable gain amplifier in the power stage in response to a gain control signal supplied from a power control circuit. This power control circuit includes a selector switch which is responsive to a select command signal to select one of prescribed discrete gain control voltages. If these control voltages are switched from the lowest to the highest value, the switched output would linearly vary in the range of power levels required for compensating for possible base-to-mobile distance variations. Sharp voltage transitions occur at the output of the selector switch as it switches from one level to another. The selected voltage is smoothed by an analog integrator since such transitions would result in the spreading of the frequency spectrum of the transmitted signal if it is directly applied to the variable gain amplifier. However, one disadvantage of the prior art power control circuit is that, due to analog circuit components of the power control circuit manual adjustments must be made before shipment to compensate for variabilities circuit parameters.

SUMMARY OF THE INVENTION

It is therefore an object of the present invention to eliminate manual adjustment of power control circuits by digitally multiplying orthogonal digital signals with a digital power control signal.

According to the present invention, there is provided a digital modulator comprising a power control circuit for producing a digital power control signal, first and second digital multipliers for multiplying digital signals having orthogonal phase relationships with the digital power control signal, and first and second digital-to-analog (D/A) converters for converting digital output signals from the first and second multipliers into analog signals. First and second low-pass filters are connected to outputs of the D/A converters, respectively, to filter out high frequency components. An orthogonal modulator is provided for mixing orthogonal phase carriers with the outputs of the first and second low-pass filters to produce first and second orthogonally modulated signals and combining the modulated signals to produce a transmit signal, which is amplified for transmission.

Preferably, the power control circuit comprises a delay circuit for delaying an input digital power control signal for a prescribed interval to produce a delayed version of the signal. A memory is provided for storing digital values in locations addressable in response to a non-delayed version of the input digital power control signal and the delayed version of the digital power control signal to produce an output digital power control signal which varies gradually during the prescribed interval when there is a difference between the delayed and non-delayed versions of the power control signal.

BRIEF DESCRIPTION OF THE DRAWINGS

The present invention will be described in further detail with reference to the accompanying drawings, in which.

DETAILED DESCRIPTION

Figure 1:
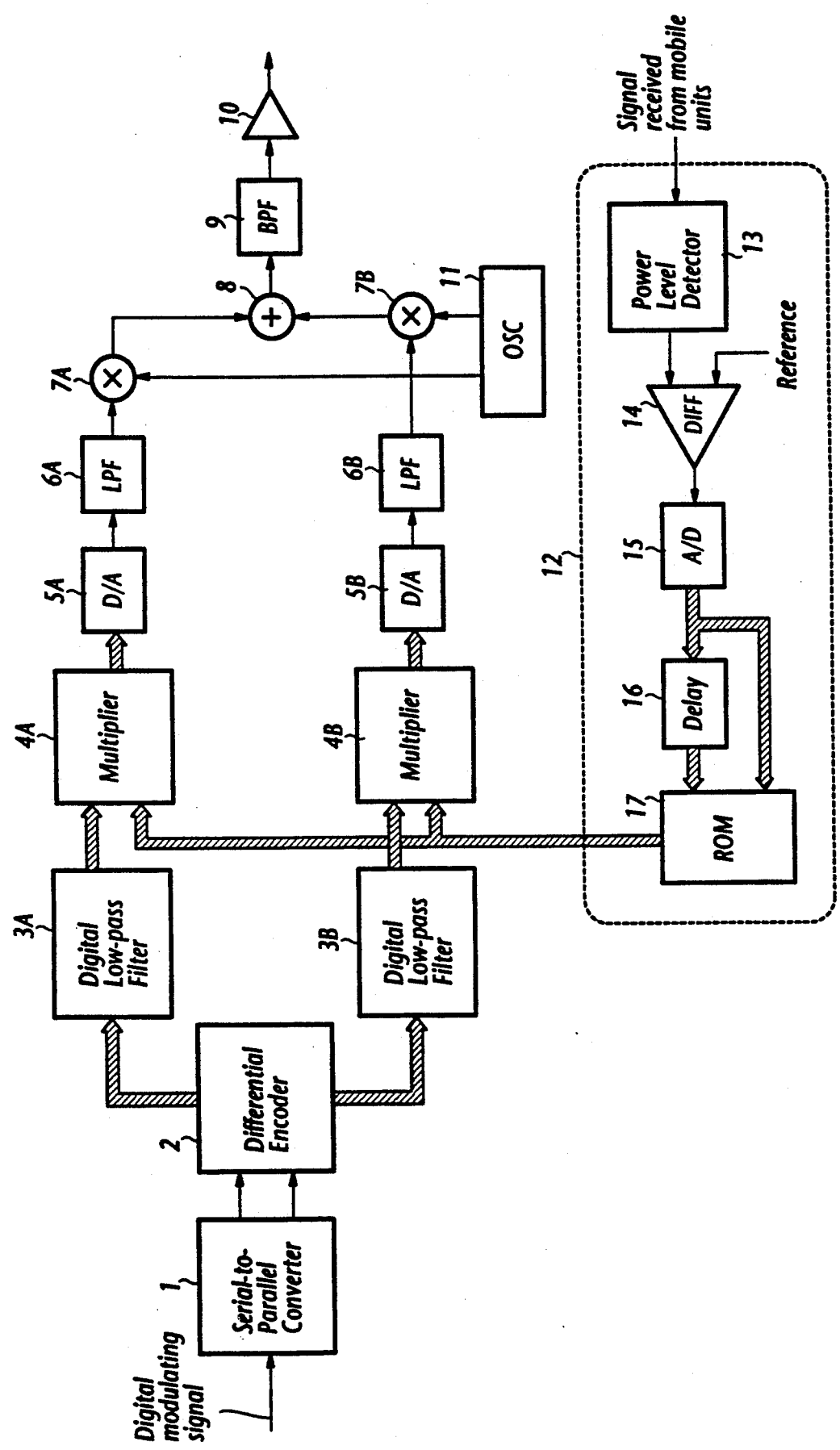
FIG. 1 is a block diagram of a digital modulator of the present invention.

Referring now to FIG. 1, there is shown a digital modulator of the present invention to be used in a base station of a cellular communication network. The digital modulator comprises a serial-to-parallel converter 1 in which transmit data is converted from serial to parallel from and applied to a known differential encoder 2 where the parallel data is differentially encoded into I and Q bit sequences. The I and Q bit sequences are passed through digital low-pass filters 3A and 3B, respectively, and applied to multipliers 4A and 4B where they are multiplied with a digital power control signal supplied from a power control circuit to control the transmission power level of the base station. The outputs of multipliers 4A and 4B are converted to analog signals by D/A converters 5A and 5B, respectively, and passed through low-pass filters 6A, 6B to mixers 7A and 7B to be respectively modulated upon in-phase and quadrature-phase carriers from an oscillator 11. The modulated orthogonal-phase carriers are combined by an adder 8 and filtered by a band-pass filter 9 and applied to an amplifier 10 for amplification and transmission from the base-station antenna, not shown.

The power control circuit 12 includes a power level detector 13 for detecting the power level of a signal received from mobile units, a differential amplifier 14 for generating a signal representative of the difference between the detected power level and a reference power level. If the mobile unit is located at far distance from the base station, the power level of the signal received from the mobile unit is low. The power control signal derived from this mobile unit raises the transmission power of the base station so that the mobile unit has a sufficient field intensity to establish communication.

The output of differential amplifier 14 is applied to an analog-to-digital converter 15 where it is converted to a corresponding digital signal which is applied as a digital power control signal to a delay circuit 16 and a read-only memory 17 as a non-delayed version of the signal. The digital power control signal is delayed for an interval T and applied to ROM 17 as a delayed version of the power control signal. The provision of delay circuit 16 is to produce a differential signal at transitions of the power control signal from one power level to another.

Figure 2:
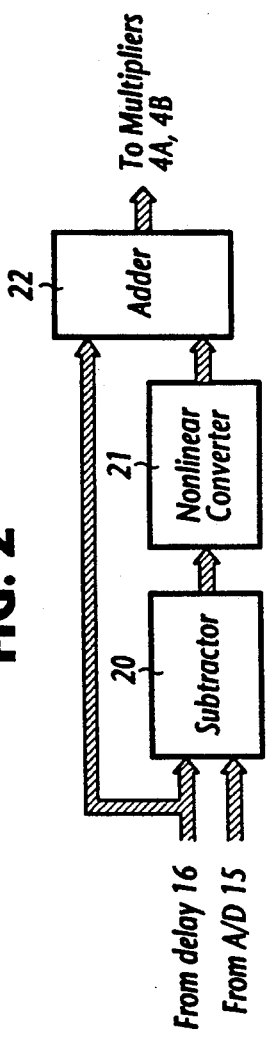
FIG. 2 is an equivalent circuit of the read only memory of FIG. 1.
Figure 3:
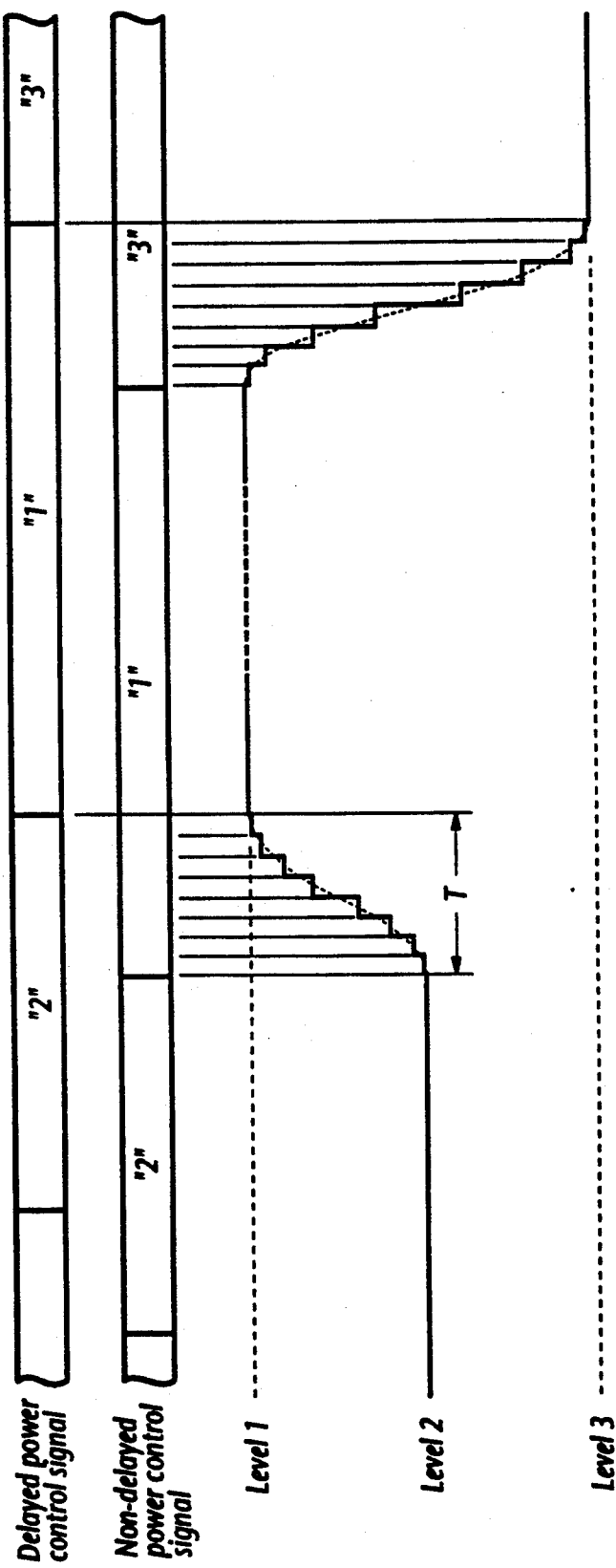
FIG. 3 is a waveform diagram showing the waveform of a digital power control signal.

As illustrated in FIG. 2, ROM 17 is equivalent to a circuit including a subtractor 20, a nonlinear converter 21 and an adder 22. Subtractor 20 detects the difference between the delayed and non-delayed versions of the digital power control data and supplies a digital difference signal to the conversion circuit 21 where it is converted to a series of nonlinear digital values. As shown in FIG. 3, if the power level is initially at level "2" and then changes to level "1", subtractor 20 produces a one-level difference signal for the duration of delay interval T. Nonlinear converter 21 translates the input signal into a series of discrete values which vary in the range of one-level difference as a particular nonlinear function such as cosine curve. The output of the nonlinear converter is applied to adder 22 where it is summed with the output of the delay circuit 16. As a result, the output of adder 22 increases from level "2" to level "1" during the delay period T, starting with smaller steps, then at increasingly larger steps followed by decreasingly smaller steps as it approaches level "1". Therefore, when the power control signal changes from level "1" to level "3", the output of adder 22 stepwisely decreases from level "1" to level "3" during the delay interval as indicated in FIG. 3.

In a practical embodiment, the mathematical representations of the subtractor 20, nonlinear converter 21 and adder 22 are calculated as a function of various input values of subtractor 20 to generate data, which is stored in ROM 17.

In this way, the power control signal that is applied to multipliers 4A and 4B, changes gradually during power level transitions. Since the outputs of multipliers 4A and 4B are converted to analog form by D/A converters 5A, 5B and low-pass filtered by LPF's 6A, 6B, the digital steps of the power control signal are smoothed into a curve and the transmission power of the base station is controlled without causing a spread of the transmission frequency spectrum.

In addition, the use of the digital technique eliminates problems associated with analog component variabilities and provides a compact power control circuit.

What is claimed is:

1. A digital modulator comprising:
   a power control circuit for producing a digital power control signal;
   first and second digital multipliers for multiplying digital signals having orthogonal phase relationships with said digital power control signal;
   first and second digital-to-analog converters for converting digital output signals from said first and second multipliers into analog signals;
   first and second low-pass filters connected to outputs of said digital-to-analog converters, respectively;
   orthogonal modulator means for mixing orthogonal phase carriers with output signals from said first and second low-pass filters to produce first and second orthogonally modulated signals and combining the modulated signals to produce a transmit signal; and
   amplifier means for amplifying the transmit signal.

2. A digital modulator as claimed in claim 1, wherein said power control circuit comprises:
   a delay circuit for delaying an input digital power control signal for a prescribed interval to produce a delayed version of the signal; and
   a memory storing digital values in locations addressable in response to a non-delayed version of said input digital power control signal and the delayed version of said digital power control signal to produce a digital multiplying signal which varies gradually during said prescribed interval when there is a difference between said delayed and non-delayed versions of the power control signal, said digital multiplying signal being applied to said digital multipliers as said digital power control signal.

3. A digital modulator as claimed in claim 2, wherein the digital values stored in said memory are derived by a circuit comprising subtractor means for detecting a difference between said delayed and non-delayed versions of the power control signal, means for generating a sequence of nonlinearly varying digital values during said prescribed interval in response to said detected difference, and adder means for summing the delayed version of said power control signal with the sequence of nonlinearly varying digital values to produce said digital values stored in said memory.

4. In a digital modulator having digital multiplier means to which a digital modulating signal is applied, digital-to-analog (D/A) converter means coupled to the output of said digital multiplier means, and low-pass filter means connected to the output of said D/A converter means, a power control circuit comprising:
   means for deriving a digital power control signal from intensity of a signal received from a mobile station;
   a delay circuit for delaying the digital power control signal for a prescribed interval to produce a delayed version of the digital power control signal; and
   a memory storing digital values in locations addressable in response to a non-delayed version of said digital power control signal and in response to the delayed version of said digital power control signal to produce a digital multiplying signal which varies gradually during said prescribed interval when there is a difference in magnitude between said delayed and non-delayed versions of the power control signal, and applying said digital multiplying signal to said digital multiplier means so that said digital modulating signal is scaled with said digital multiplying signal.

5. A power control circuit as claimed in claim 4, wherein the digital values stored in said memory are derived by a circuit comprising subtractor means for detecting a difference between said delayed and non-delayed versions of the power control signal, means for generating a sequence of nonlinearly varying digital values during said prescribed interval in response to said detected difference, and adder means for summing the delayed version of said power control signal with the sequence of nonlinearly varying digital values to produce said digital values stored in said memory.

6. In a mobile communication system having a base station and a plurality of mobile stations, said base station comprising:
   a power control circuit for receiving a signal from a mobile station and producing a digital power control signal representative of the power level of the received signal;
   first and second digital multipliers for multiplying digital signals having orthogonal phase relationships with said digital power control signal;
   first and second digital-to-analog converters for converting digital output signals from said first and second multipliers into analog signals;
   first and second low-pass filters connected to outputs of said digital-to-analog converters, respectively;
   orthogonal modulator means for mixing orthogonal phase carriers with output signals from said first and second low-pass filters to produce first and second orthogonally modulated signals and combining the modulated signals to produce a transmit signal; and constant-gain amplifier means for amplifying the transmit signal for transmission to said mobile station.

7. A base station as claimed in claim 6, wherein said power control circuit comprises:
 a delay circuit for delaying an input digital power control signal for a prescribed interval to produce a delayed version of the signal; and
 a memory storing digital values in locations addressable in response to a non-delayed version of said input digital power control signal and the delayed version of said digital power control signal to produce a digital multiplying signal which varies gradually during said prescribed interval when there is a difference between said delayed and non-delayed versions of the power control signal, said digital multiplying signal being applied to said digital multipliers as said digital power control signal.

* * * * *